(12) United States Patent
Niimura

(10) Patent No.: US 12,171,089 B2
(45) Date of Patent: Dec. 17, 2024

(54) LIGHT-SOURCE APPARATUS AND DISTANCE MEASUREMENT APPARATUS

(71) Applicant: DENSO CORPORATION, Kariya (JP)

(72) Inventor: Kosuke Niimura, Kariya (JP)

(73) Assignee: DENSO CORPORATION, Kariya (JP)

( * ) Notice: Subject to any disclaimer, the term of this patent is extended or adjusted under 35 U.S.C. 154(b) by 494 days.

(21) Appl. No.: 17/382,851

(22) Filed: Jul. 22, 2021

(65) Prior Publication Data

US 2021/0352833 A1  Nov. 11, 2021

Related U.S. Application Data

(63) Continuation of application No. PCT/JP2020/001867, filed on Jan. 21, 2020.

(30) Foreign Application Priority Data

Jan. 25, 2019 (JP) .................. 2019-011445

(51) Int. Cl.
*H05K 9/00* (2006.01)
*H01S 5/02218* (2021.01)
*G01S 7/481* (2006.01)

(52) U.S. Cl.
CPC ....... *H05K 9/0024* (2013.01); *H01S 5/02218* (2021.01); *G01S 7/4814* (2013.01)

(58) Field of Classification Search
CPC ...................................................... H05K 5/00
See application file for complete search history.

(56) References Cited

U.S. PATENT DOCUMENTS

| 2003/0091303 A1* | 5/2003 | Kami | .................. G02B 6/4277 385/14 |
| 2018/0204783 A1* | 7/2018 | Han | ..................... H05K 9/0088 |

FOREIGN PATENT DOCUMENTS

| JP | 2001174669 A | 6/2001 |
| JP | 2004-335691 A | 11/2004 |
| JP | 2005-284167 A | 10/2005 |
| JP | 2007-88065 A | 4/2007 |
| JP | 5391753 B2 | 10/2013 |

OTHER PUBLICATIONS

U.S. Appl. No. 17/382,827 and its entire file history, filed Jul. 22, 2021, Niimura.

\* cited by examiner

*Primary Examiner* — Jerry Wu
(74) *Attorney, Agent, or Firm* — MASCHOFF BRENNAN

(57) ABSTRACT

A light-source apparatus includes a light-source chip, a case, first and second electrically-conductive parts, a substrate, an electromagnetic shield plate, an electrically-conductive layer and an electrically-conductive unit. The light-source chip is received in the case. Each of the first and second electrically-conductive parts is a part of the case. The case is mounted to the substrate. The electromagnetic shield plate covers at least part of the substrate. The electrically-conductive layer is formed on the substrate and electrically connected with both the second electrically-conductive part and the electromagnetic shield plate. The electrically-conductive unit is provided to electrically connect the first electrically-conductive part and the electromagnetic shield plate.

5 Claims, 7 Drawing Sheets

LIGHT-SOURCE APPARATUS AND DISTANCE MEASUREMENT APPARATUS

CROSS-REFERENCE TO RELATED APPLICATIONS

The present application is a continuation application of International Application No. PCT/JP2020/001867 filed on Jan. 21, 2020, which is based on and claims priority from Japanese Patent Application No. 2019-011445 filed on Jan. 25, 2019. The entire contents of these applications are incorporated by reference into the present application.

BACKGROUND

1 Technical Field

The present disclosure relates to a light-source apparatus and a distance measurement apparatus that includes the light-source apparatus.

2 Description of Related Art

There is disclosed, for example in Japanese Patent No. JP 5391753 B2, a light-source apparatus that includes a light-source chip.

SUMMARY

According to the present disclosure, there is provided a light-source apparatus which includes a light-source chip, a case, first and second electrically-conductive parts, a substrate, an electromagnetic shield plate, an electrically-conductive layer and an electrically-conductive unit. The light-source chip is received in the case. Each of the first and second electrically-conductive parts is a part of the case. The case is mounted to the substrate. The electromagnetic shield plate covers at least part of the substrate. The electrically-conductive layer is formed on the substrate and electrically connected with both the second electrically-conductive part and the electromagnetic shield plate. The electrically-conductive unit is provided to electrically connect the first electrically-conductive part and the electromagnetic shield plate.

DESCRIPTION OF EMBODIMENTS

There are known light-source apparatuses which include a light-source chip, a case, a light-source chip drive circuit and a substrate. The light-source chip is received in the case. Both the case and the light-source chip drive circuit are mounted to the substrate. However, the inventor of the present application has found, through detailed investigation, that in the known light-source apparatuses, noise current originating from the light-source chip drive circuit may flow to other circuits and/or electronic components mounted to the substrate, causing them to malfunction.

In contrast, in the above-described light-source apparatus according to the present disclosure, the first electrically-conductive part, the electrically-conductive unit, the electromagnetic shield plate, the electrically-conductive layer and the second electrically-conductive part are electrically connected to one another. Consequently, it becomes possible to increase noise current which flows through the electrically-conductive unit, the electromagnetic shield plate, the electrically-conductive layer and the second electrically-conductive part in the light-source apparatus. As a result, it becomes possible to suppress noise current which flows through other circuits and/or electronic components mounted to the substrate, thereby suppressing malfunction of these circuits and/or electronic components due to the noise current flowing therethrough.

One exemplary embodiment will be described hereinafter with reference to the drawings.

Figure 1:
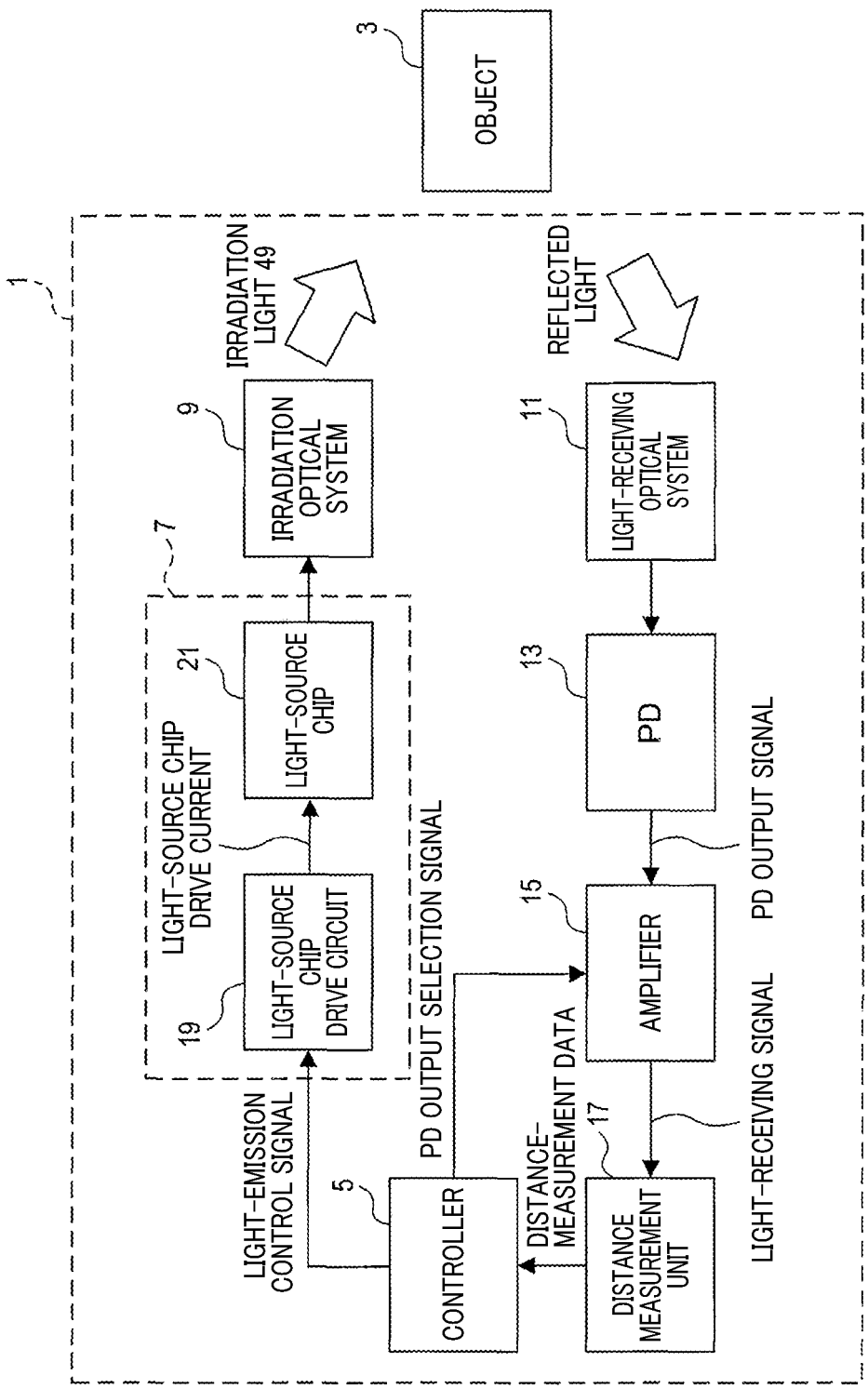
FIG. 1 is a block diagram illustrating the overall configuration of a distance measurement apparatus according to an exemplary embodiment.

FIG. 1 illustrates the overall configuration of a distance measurement apparatus 1 according to the exemplary embodiment. The distance measurement apparatus 1 is configured to be installed in, for example, a vehicle to measure the distance from the distance measurement apparatus 1 (or from the vehicle) to an object 3. The object 3 is, for example, a target existing in the vicinity of the vehicle.

As shown in FIG. 1, the distance measurement apparatus 1 includes a controller 5, a light-source apparatus 7, an irradiation optical system 9, a light-receiving optical system 11, a photodiode (to be referred to as PD hereinafter) 13, an amplifier 15 and a distance measurement unit 17. Moreover, the light-source apparatus 7 includes a light-source chip drive circuit 19 and a light-source chip 21.

In the present embodiment, the distance measurement apparatus 1 measures the distance from the distance measurement apparatus 1 to the object 3 in the following manner.

First, the controller 5 sends a light-emission control signal to the light-source chip drive circuit 19. Then, the light-source chip drive circuit 19 supplies, according to the light-emission control signal, a light-source chip drive current to the light-source chip 21. Upon the supply of the light-source chip drive current, the light-source chip 21 irradiates an irradiation light 49. Then, the irradiation light 49 reaches the object 3 via the irradiation optical system 9. In addition, the wavelength of the irradiation light 49 may be, for example, in the range of 850 to 950 nm.

The object 3 reflects the irradiation light 49, thereby generating a reflected light. The reflected light reaches the PD 13 via the light-receiving optical system 11. The PD 13 generates a PD output signal according to the reflected light. The amplifier 15 amplifies the PD output signal to generate a light-receiving signal. The controller 5 sends a PD output selection signal to the amplifier 15. The distance measurement unit 17 generates distance-measurement data on the basis of the light-receiving signal. The controller 5 receives the distance-measurement data. Then, the controller 5 calculates the distance from the distance measurement apparatus 1 to the object 3 on the basis of the time difference between the time point at which the light-emission control signal is sent and the time point at which the distance-measurement data is received.

Next, the detailed configuration of the light-source apparatus 7 according to the present embodiment will be described with reference to FIGS. 2-6.

Figure 2:
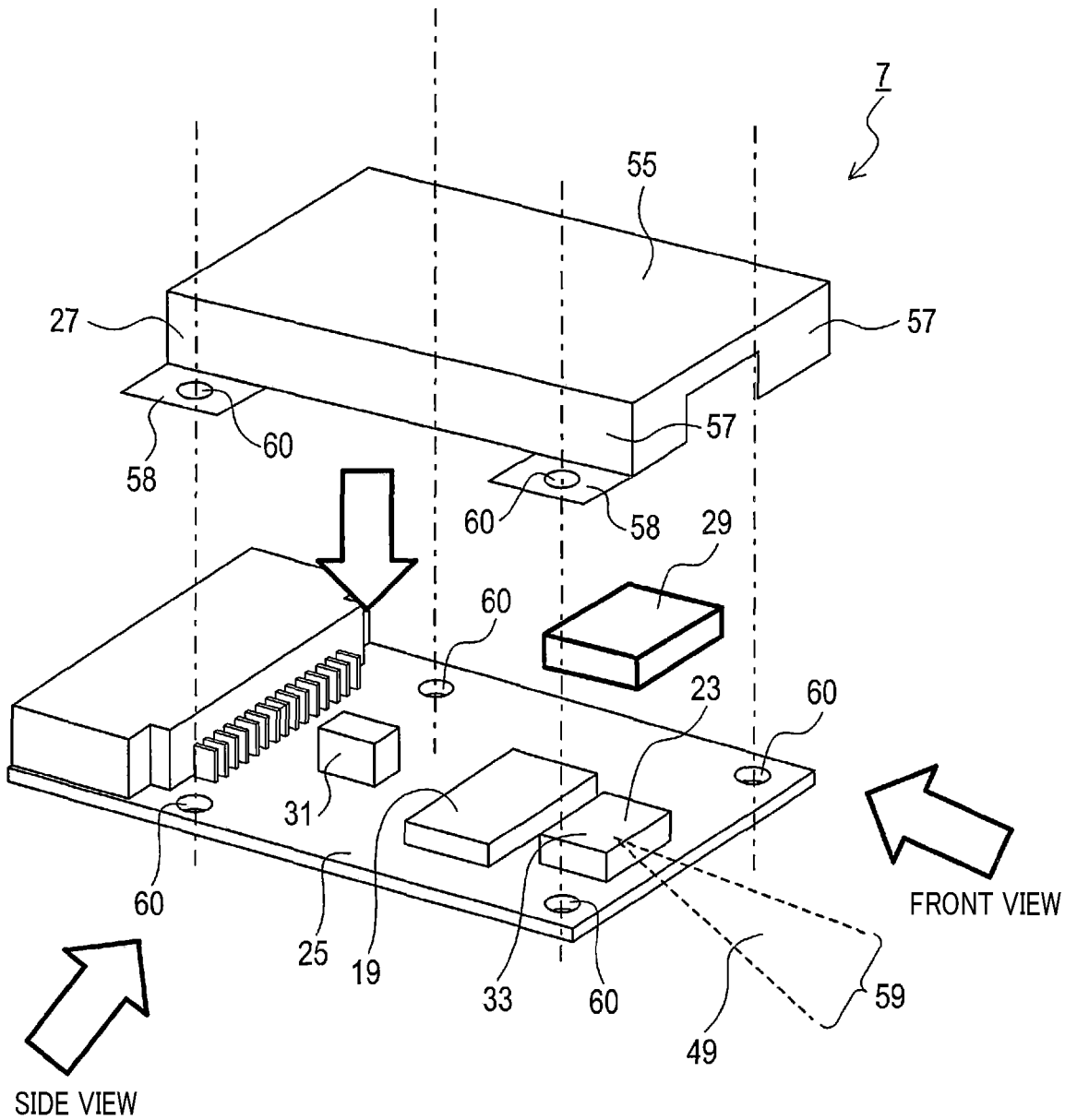
FIG. 2 is an exploded perspective view illustrating the configuration of a light-source apparatus according to the exemplary embodiment.

As shown in FIG. 2, the light-source apparatus 7 includes a light-source unit 23, a substrate 25, an electromagnetic shield plate 27, an electrically-conductive unit (or electrical conductor) 29, the aforementioned light-source chip drive circuit 19 and other electronic components 31.

Figure 5:
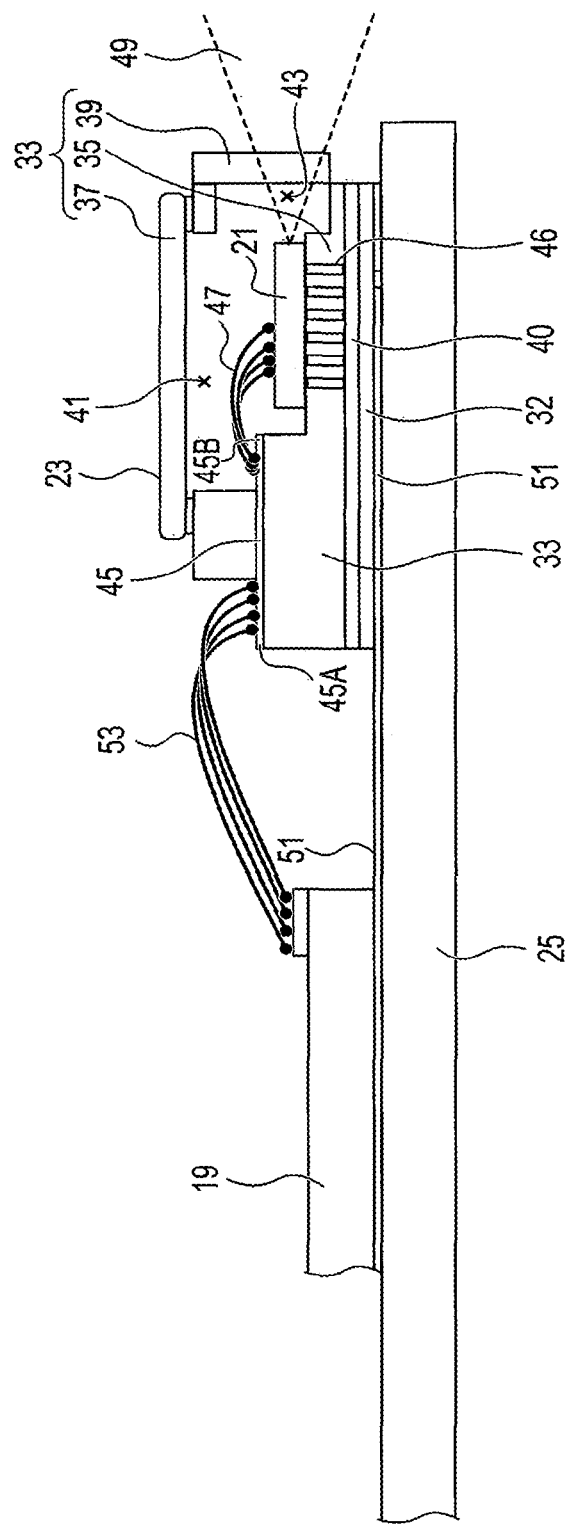
FIG. 5 is a schematic cross-sectional view of the light-source apparatus, wherein hatching lines are not depicted for the sake of simplicity.
Figure 6:
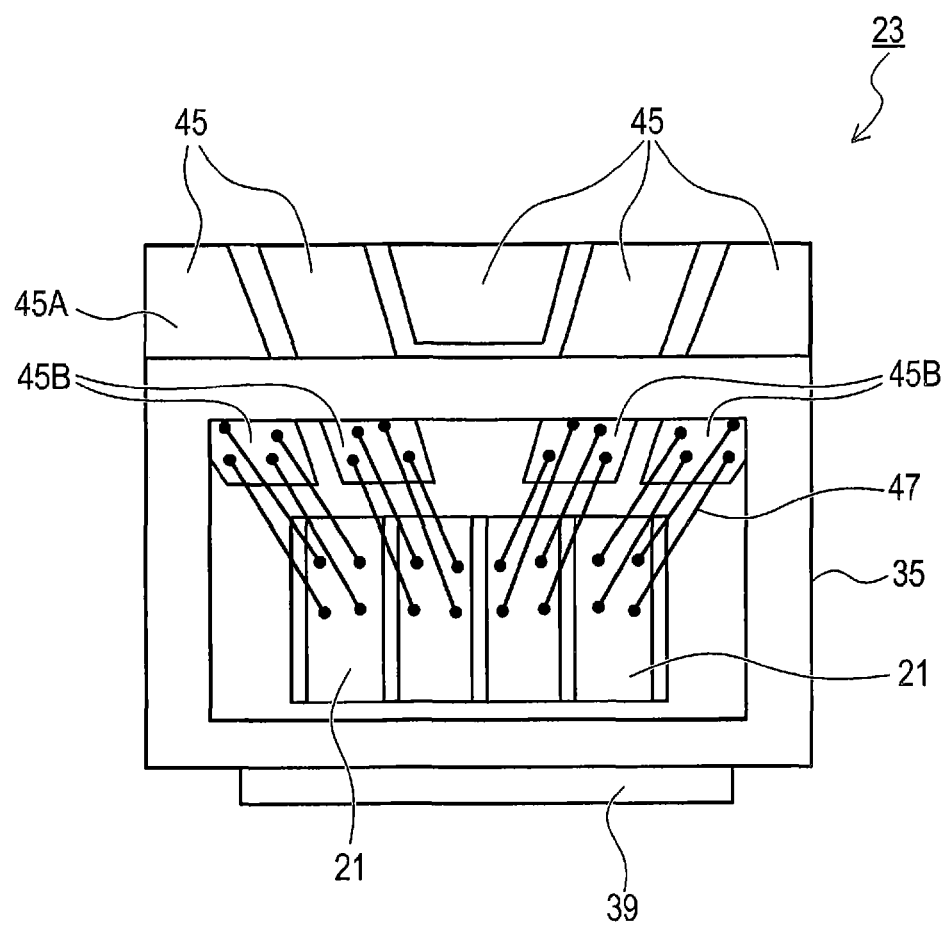
FIG. 6 is a plan view of a light-source unit of the light-source apparatus, omitting a metal lid of the light-source unit.

As shown in FIGS. 5 and 6, the light-source unit 23 includes the aforementioned light-source chip 21 and a case 33. The light-source chip 21 may be implemented by, for example, a laser diode.

The case 33 receives the light-source chip 21 therein. As shown in FIG. 5, the case 33 includes a main body 35, a metal lid 37, an exit window 39, a lower electrode pad 40, a plurality of upper electrode pads 45 and vias 46.

As shown in FIGS. 5 and 6, the main body 35 is box-shaped and made of ceramic. The main body 35 has both a first opening 41 and a second opening 43, at each of which the main body 35 opens.

The lower electrode pad 40 is formed on a lower surface of the main body 35 which faces the substrate 25. The lower electrode pad 40 has electrical conductivity. In addition, the lower electrode pad 40 constitutes a second electrically-conductive part of the case 33.

The upper electrode pads 45 are formed in the main body 35 so as to be located away from the substrate 25. Each of the upper electrode pads 45 has a first part 45A located outside the main body 35 and a second part 45B located inside the main body 35. The second part 45B and the light-source chip 21 are connected by a plurality of wires 47. Moreover, as shown in FIG. 5, the wires 47 are located closer to the metal lid 37 than the light-source chip 21 is.

Each of the vias 46 has one end abutting the light-source chip 21 and the other end abutting the lower electrode pad 40.

The metal lid 37 is plate-shaped and made of metal. The metal lid 37 is arranged to close the first opening 41. The metal lid 37 has electrical conductivity. In addition, the metal lid 37 constitutes a first electrically-conductive part of the case 33.

Moreover, as shown in FIG. 5, the metal lid 37 and the lower electrode pad 40 are arranged to have both the light-source chip 21 and the wires 47 interposed therebetween.

The exit window 39 is plate-shaped and made of transparent glass. The exit window 39 is arranged to close the second opening 43. The irradiation light 49 irradiated by the light-source chip 21 passes through the exit window 39 and is then directed to the irradiation optical system 9 shown in FIG. 1. In addition, the inside of the case 33 is hermetically sealed and filled with an inert gas.

As shown in FIG. 2, all of the light-source unit 23, the light-source chip drive circuit 19 and the electronic components 31 are mounted on the substrate 25.

Moreover, as shown in FIG. 5, the substrate 25 has an electrically-conductive layer 51 formed on an upper surface thereof. The electrically-conductive layer 51 may be, for example, a ground. Furthermore, to the electrically-conductive layer 51, there is joined the lower electrode pad 40 via a solder layer 32. Consequently, the electrically-conductive layer 51 is electrically connected to the lower electrode pad 40.

Figure 3:
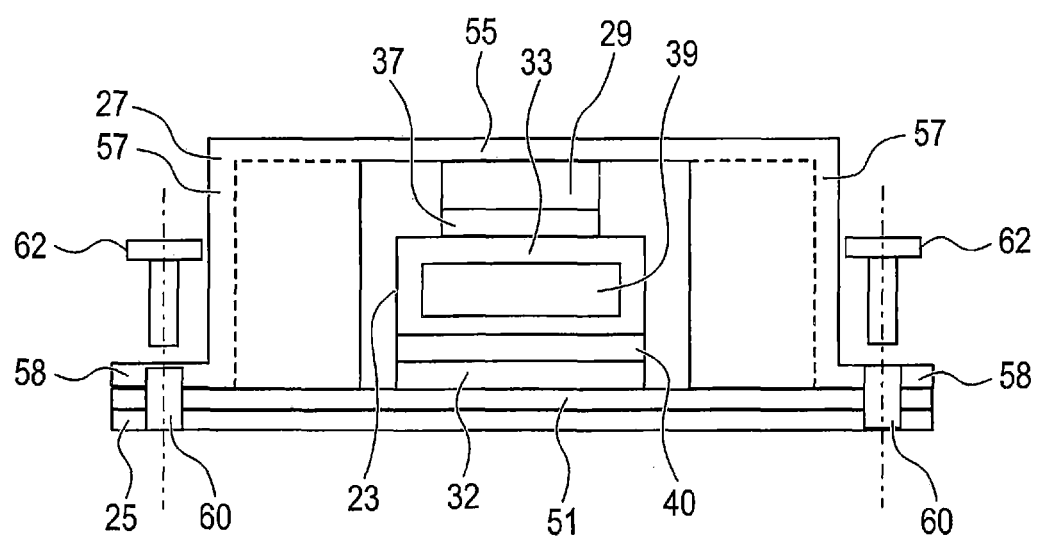
FIG. 3 is a front view of the light-source apparatus along the direction of arrow "front view" in FIG. 2.

The electromagnetic shield plate 27 is a member made of metal. The electromagnetic shield plate 27 is provided to block noise generated by the light-source chip drive circuit 19, the electronic components 31 and the like. As shown in FIGS. 2 and 3, the electromagnetic shield plate 27 includes a main body 55, side portions 57 and flange portions 58.

The main body 55 is rectangular plate-shaped. The side portions 57 are formed respectively at the four sides of the main body 55. Moreover, the side portions 57 each extend in the thickness direction of the main body 55 toward the substrate 25. The flange portions 58 are formed on two of the side portions 57 which face each other. Each of the flange portions 58 extends outward from a lower end of a corresponding one of the side portions 57. Here, the lower ends of the side portions 57 denote the ends of the side portions 57 on the substrate 25 side.

Figure 4:
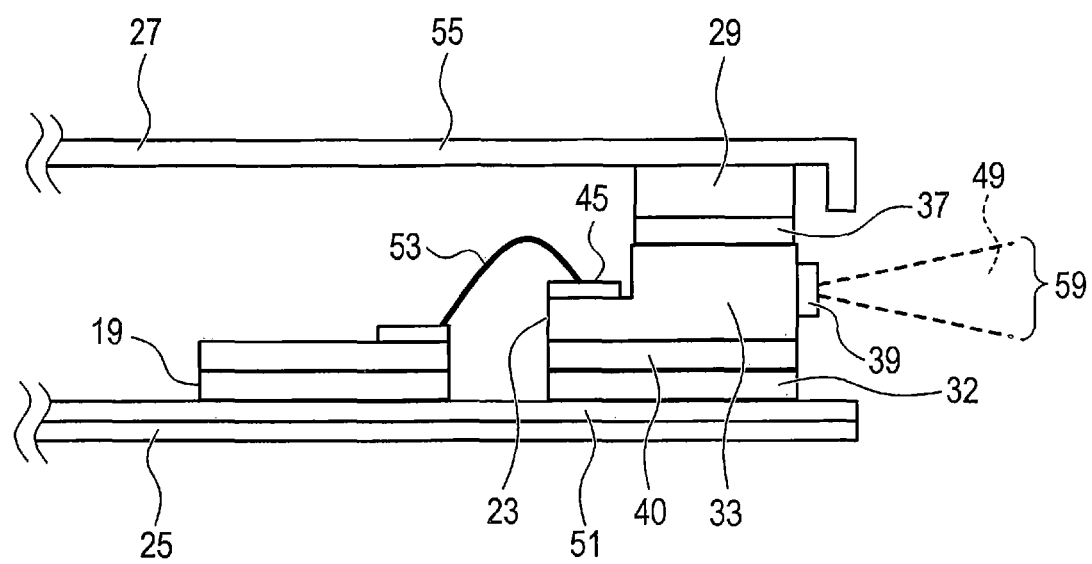
FIG. 4 is a side view of the light-source apparatus along the direction of arrow "side view" in FIG. 2.

As shown in FIGS. 3 and 4, the main body 55 of the electromagnetic shield plate 27 covers part of the substrate 25. That is, when viewed along the thickness direction of the substrate 25, the main body 55 of the electromagnetic shield plate 27 overlaps part of the substrate 25. Moreover, on that part of the substrate 25 which is covered by the main body 55 of the electromagnetic shield plate 27, there are mounted all of the light-source unit 23, the light-source chip drive circuit 19 and the electronic components 31. Consequently, all of the light-source unit 23, the light-source chip drive circuit 19 and the electronic components 31 are interposed between the substrate 25 and the main body 55 of the electromagnetic shield plate 27.

Furthermore, as shown in FIG. 3, the flange portions 58 of the electromagnetic shield plate 27 are arranged to abut the electrically-conductive layer 51 formed on the upper surface of the substrate 25. Consequently, the electrically-conductive layer 51 is electrically connected to the electromagnetic shield plate 27. In the substrate 25, the electrically-conductive layer 51 and the flange portions 58, there are respectively formed holes 60 to penetrate them. The flange portions 58 are fixed to the substrate 25 by fastening fixing members (e.g., screws or bolts) 62 into the holes 60.

As shown in FIGS. 3 and 4, the electrically-conductive unit 29 is mounted between the light-source unit 23 and the main body 55 of the electromagnetic shield plate 27. Consequently, the electrically-conductive unit 29 abuts both the metal lid 37 of the case 33 of the light-source unit 23 and the main body 55 of the electromagnetic shield plate 27. Moreover, the electrically-conductive unit 29 has electrical conductivity. Hence, the electrically-conductive unit 29 is electrically connected with both the metal lid 37 and the electromagnetic shield plate 27.

The electrically-conductive unit 29 may be a solid member or in the form of a paste. In the case of the electrically-conductive unit 29 being a solid member, the shape of the electrically-conductive unit 29 is not particularly limited. For example, in this case, the electrically-conductive unit 29 may have a prismatic shape, a cylindrical shape or a plate shape.

Moreover, in the case of the electrically-conductive unit 29 being a solid member, the material of the electrically-conductive unit 29 may be, for example, a metal or a resin composition that includes an electrically-conductive filler. Further, the electrically-conductive filler may be, for example, a metal filler. On the other hand, in the case of the electrically-conductive unit 29 being in the form of a paste, the material of the electrically-conductive unit 29 may be, for example, a mixture of an electrically-conductive filler and silicone. In addition, silicone is a synthetic polymer compound having a backbone formed by siloxane bonds.

In the present embodiment, the outer surface of the electrically-conductive unit 29 is black in color. Moreover, on the outer surface of the electrically-conductive unit 29, the reflectivity (or reflectance) to the irradiation light 49, which is irradiated by the light-source chip 21, is lower than or equal to 5%. For example, when the wavelength of the irradiation light 49 is in the range of 850 950 nm, the reflectivity of the outer surface of the electrically-conductive unit 29 to the irradiation light 49 whose wavelength is in the range of 850 to 950 nm is lower than or equal to 5%.

Furthermore, in the present embodiment, as shown in FIG. 4, the electrically-conductive unit 29 is located outside the irradiation region 59 of the irradiation light 49. Here, the irradiation region 59 denotes the region within which the irradiation light 49 is irradiated.

As shown in FIG. 5, the light-source chip drive circuit 19 and the first parts 45A of the upper electrode pads 45 are connected by a plurality of wires 53. Consequently, the light-source chip drive circuit 19 and the light-source chip 21 are electrically connected to each other via the wires 53, the upper electrode pads 45 and the wires 47.

According to the present embodiment, it is possible to achieve the following advantageous effects.

In the present embodiment, the light-source apparatus 7 includes the light-source chip 21, the case 33, the substrate 25, the electromagnetic shield plate 27, the electrically-conductive layer 51 and the electrically-conductive unit 29. The light-source chip 21 is received in the case 33. The case 33 includes the metal lid 37 (or the first electrically-conductive part) and the lower electrode pad 40 (or the second electrically-conductive part). The case 33 is mounted to the substrate 25. The electromagnetic shield plate 27 covers part of the substrate 25. The electrically-conductive layer 51 is formed on the substrate 25 and electrically connected with both the lower electrode pad 40 and the electromagnetic shield plate 27. The electrically-conductive unit 29 is provided to electrically connect the metal lid 37 and the electromagnetic shield plate 27.

Figure 7:
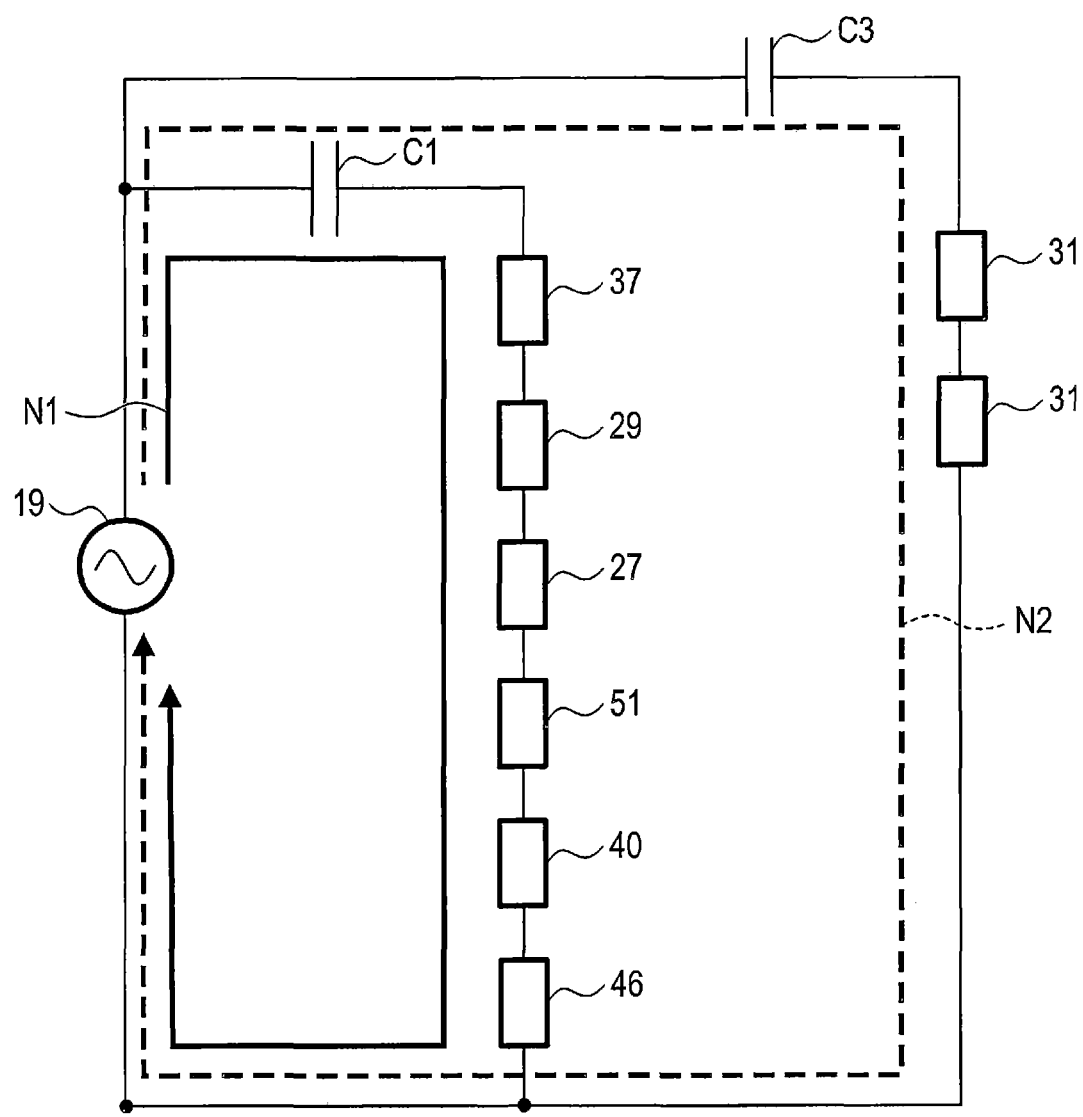
FIG. 7 is an explanatory diagram illustrating noise currents flowing in the light-source apparatus.

With the above configuration, as illustrated in FIG. 7, in the light-source apparatus 7, the metal lid 37, the electrically-conductive unit 29, the electromagnetic shield plate 27, the electrically-conductive layer 51 and the lower electrode pad 40 are electrically connected to one another. In FIG. 7, C1 represents the stray capacitance between the light-source chip drive circuit 19 and the metal lid 37; and C3 represents the stray capacitance between the light-source chip drive circuit 19 and the electronic components 31. In the light-source apparatus 7, noise currents N1 and N2 flow with the light-source chip drive current being the noise source.

With the metal lid 37, the electrically-conductive unit 29, the electromagnetic shield plate 27, the electrically-conductive layer 51 and the lower electrode pad 40 electrically connected to one another, the noise current N1 is increased. Here, the noise current N1 is noise current which flows through the electrically-conductive unit 29, the electromagnetic shield plate 27, the electrically-conductive layer 51 and the lower electrode pad 40 in the light-source apparatus 7.

As a result, it becomes possible to suppress the noise current N2, thereby suppressing malfunction of the electronic components 31 due to the noise current N2. Here, the noise current N2 is noise current which flows through the electronic components 31 in the light-source apparatus 7.

Moreover, in the present embodiment, the outer surface of the electrically-conductive unit 29 is black in color. Therefore, if stray light caused by the irradiation light 49 is incident on the outer surface of the electrically-conductive unit 29, it will be difficult for the outer surface of the electrically-conductive unit 29 to reflect the stray light. As a result, it becomes possible to suppress the stray light in the light-source apparatus 7.

In the present embodiment, the reflectivity of the outer surface of the electrically-conductive unit 29 to the irradiation light 49, which is irradiated by the light-source chip 21, is lower than or equal to 5%. Therefore, if stray light caused by the irradiation light 49 is incident on the outer surface of the electrically-conductive unit 29, it will be difficult for the outer surface of the electrically-conductive unit 29 to reflect the stray light. As a result, it becomes possible to suppress the stray light in the light-source apparatus 7.

In the present embodiment, the electrically-conductive unit 29 is located outside the irradiation region 59 within which the irradiation light 49 is irradiated. As a result, it becomes possible to prevent the electrically-conductive unit 29 from blocking the irradiation light 49.

In the present embodiment, the light-source chip 21 and the light-source chip drive circuit 19 are electrically connected to each other via the wires 47 which may generate noise. However, as shown in FIG. 5, the wires 47 are located closer to the metal lid 37 than the light-source chip 21 is. As a result, if noise is generated by the wires 47, it will be possible to suppress the influence of the noise on the light-source chip 21.

In addition, the distance measurement apparatus 1 according to the present embodiment includes the light-source apparatus 7 as described above. Therefore, it is possible to achieve the above-described advantageous effects in the distance measurement apparatus 1.

While the above particular embodiment has been shown and described, it will be understood by those skilled in the art that various modifications, changes, and improvements may be made without departing from the spirit of the present disclosure.

For example, in the above-described embodiment, the main body 55 of the electromagnetic shield plate 27 is configured to cover only part of the substrate 25. However, the main body 55 of the electromagnetic shield plate 27 may alternatively be configured to cover the entire substrate 25.

In the above-described embodiment, the main body 35 of the case 33 is made of ceramic. However, the main body 35 of the case 33 may alternatively be made of other materials than ceramic, such as resin.

In the above-described embodiment, the case 33 has the metal lid 37 that is made of metal. However, the case 33 may have, instead of the metal lid 37, a lid that is made of other electrically-conductive materials than metal, such as an electrically-conductive resin.

In the above-described embodiment, the electrically-conductive unit 29 is configured so that the entire outer surface of the electrically-conductive unit 29 is black in color. However, the electrically-conductive unit 29 may alternatively be configured so that part or the whole of the outer surface of the electrically-conductive unit 29 is not black in color.

In the above-described embodiment, the electrically-conductive unit 29 is configured so that on the entire outer surface of the electrically-conductive unit 29, the reflectivity to the irradiation light 49 is lower than or equal to 5%. However, the electrically-conductive unit 29 may alternatively be configured so that on part or the whole of the outer surface of the electrically-conductive unit 29, the reflectivity to the irradiation light 49 is higher than 5%.

In the above-described embodiment, the light-source apparatus 7 is applied to the distance measurement apparatus 1. However, the light-source apparatus 7 may also be applied to other apparatuses, such as an image formation apparatus.

In the above-described embodiment, the electrically-conductive unit 29 is formed as a separate component from the electromagnetic shield plate 27. As an alternative, the electrically-conductive unit 29 may be formed integrally with the electromagnetic shield plate 27 into one piece. As another alternative, the electrically-conductive unit 29 may be formed as part of the electromagnetic shield plate 27.

In the above-described embodiment, the electrically-conductive unit 29 is formed as a separate component from the metal lid 37. As an alternative, the electrically-conductive unit 29 may be formed integrally with the metal lid 37 into one piece. As another alternative, the electrically-conductive unit 29 may be formed as part of the metal lid 37.

In the above-described embodiment, the light-source chip drive circuit 19 is arranged outside the case 33. However, the light-source chip drive circuit 19 may alternatively be received in the case 33.

In the above-described embodiment, the first electrically-conductive part of the case 33 is constituted of the metal lid 37. However, the first electrically-conductive part may alternatively be constituted of other members than the metal lid 37, such as an electrically-conductive layer formed on that part of the main body 35 of the case 33 which abuts the electrically-conductive unit 29.

In the above-described embodiment, the second electrically-conductive part of the case 33 is constituted of the lower electrode pad 40. However, the second electrically-conductive part may alternatively be constituted of other members than the lower electrode pad 40, such as a metal lid that covers an opening formed at the bottom of the main body 35 of the case 33.

A plurality of functions realized by a single component in the above-described embodiment may alternatively be realized respectively by a plurality of components. Moreover, a single function realized by a single component in the above-described embodiment may alternatively be realized by a plurality of components together. In contrast, a plurality of functions realized respectively by a plurality of components in the above-described embodiment may alternatively be realized by a single component. Moreover, a single function realized by a plurality of components together in the above-described embodiment may alternatively be realized by a single component. Furthermore, part of the configuration of the above-described embodiment may be omitted. In addition, the configuration of the above-described embodiment may be partially replaced with the configuration of any other possible embodiment.

In addition to the light-source apparatus 7 described above, the present disclosure may also be embodied in various modes such as: a system that includes the light-source apparatus 7 as a component thereof; a program for enabling a computer to function as the controller 5; a non-transitory tangible recording medium (e.g., a semiconductor memory) in which the aforementioned program is recorded; a method of reducing noise in the light-source apparatus 7; and a noise reduction structure of the light-source apparatus 7.

What is claimed is:

1. A light-source apparatus comprising: a light-source chip; a case in which the light-source chip is received; a first electrically-conductive part and a second electrically-conductive part each of which is apart of the case and located on opposite ends; a substrate to which the case is mounted; an electromagnetic shield plate covering at least part of the substrate, the first and second electrically-conductive parts and the case; an electrically-conductive layer formed on the substrate and electrically connected with both the second electrically-conductive part and the electromagnetic shield plate; and an electrically-conductive unit electrically connecting the first electrically-conductive part and the electromagnetic shield plate, wherein the case is interposed between the substrate and the electromagnetic shield plate; and the electrically-conductive unit is located outside an irradiation region within which light is irradiated by the light-source chip.

2. The light-source apparatus as set forth in claim 1, wherein at least part of an outer surface of the electrically-conductive unit is black in color.

3. The light-source apparatus as set forth in claim 1, wherein on at least part of an outer surface of the electrically-conductive unit, a reflectivity to light irradiated by the light-source chip is lower than or equal to 5%.

4. The light-source apparatus as set forth in claim 1, further comprising:
a light-source chip drive circuit configured to drive the light-source chip; and
a plurality of wires via which the light-source chip and the light-source chip drive circuit are electrically connected to each other,
wherein
the wires are located closer to the first electrically-conductive part than the light-source chip is.

5. A distance measurement apparatus comprising the light-source apparatus as set forth in claim 1.

* * * * *